(12) United States Patent
Arahata et al.

(10) Patent No.: US 8,042,725 B2
(45) Date of Patent: *Oct. 25, 2011

(54) WIRE BONDING METHOD, WIRE BONDING APPARATUS, AND WIRE BONDING CONTROL PROGRAM

(75) Inventors: Toru Arahata, Tokyo (JP); Shinobu Ishii, Tokyo (JP); Hiromi Fujisawa, Tokyo (JP)

(73) Assignee: Kaijo Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/765,381

(22) Filed: Apr. 22, 2010

(65) Prior Publication Data

US 2010/0206940 A1 Aug. 19, 2010

Related U.S. Application Data

(63) Continuation of application No. 12/263,589, filed on Nov. 3, 2008, now Pat. No. 7,748,599.

(30) Foreign Application Priority Data

Sep. 10, 2008 (JP) ................................. 2008-232600

(51) Int. Cl.
*B23K 31/02* (2006.01)
(52) U.S. Cl. ...................................... 228/180.5; 228/4.5
(58) Field of Classification Search .................. None
See application file for complete search history.

(56) References Cited

U.S. PATENT DOCUMENTS

| | | | |
|---|---|---|---|
| 5,156,323 A | | 10/1992 | Kumazawa et al. |
| 5,421,503 A * | | 6/1995 | Perlberg et al. ............... 228/4.5 |
| 5,437,405 A * | | 8/1995 | Asanasavest .............. 228/180.5 |
| 5,485,949 A * | | 1/1996 | Tomura et al. ............. 228/180.5 |
| 5,559,054 A * | | 9/1996 | Adamjee ...................... 438/617 |
| 5,871,141 A * | | 2/1999 | Hadar et al. ............... 228/180.5 |
| 5,884,830 A * | | 3/1999 | Yamazaki et al. ............ 228/1.1 |
| 5,906,308 A * | | 5/1999 | Yamazaki et al. ............ 228/4.5 |
| 6,041,995 A * | | 3/2000 | Takahashi et al. ........... 228/164 |
| 6,207,549 B1 * | | 3/2001 | Higashi et al. ............... 438/613 |
| 6,213,378 B1 * | | 4/2001 | Singh ....................... 228/110.1 |
| 6,244,499 B1 | | 6/2001 | Tsai et al. |
| 6,622,903 B1 | | 9/2003 | Greenwell |
| 6,715,666 B2 * | | 4/2004 | Imai et al. ................. 228/180.5 |
| 6,815,836 B2 | | 11/2004 | Ano |

(Continued)

FOREIGN PATENT DOCUMENTS

JP 2004-172477 A 6/2004

(Continued)

*Primary Examiner* — Kiley Stoner

(74) *Attorney, Agent, or Firm* — Holtz, Holtz, Goodman & Chick, P.C.

(57) ABSTRACT

The invention provides a wire bonding method which enables formation of a low loop having a height not exceeding two times the wire diameter and secures sufficient pull strength of the wire even with the low loop shape. After having formed a contact-bonded ball at a first bonding point, a capillary moves upward and then toward a second bonding point to press a side surface of an upper portion of the contact-bonded ball, so that a protruded portion is formed on a top portion of the contact-bonded ball on the side of the second bonding point. After having formed the protruded portion of the contact-bonded ball, the capillary moves upward, and then downward while moving toward the second bonding point to press the protruded portion, so that a wire drawing portion for drawing the wire from the top portion of the contact-bonded ball horizontally is formed.

1 Claim, 10 Drawing Sheets

U.S. PATENT DOCUMENTS

| | | |
|---|---|---|
| 7,025,247 B2 | 4/2006 | Mii et al. |
| 7,044,357 B2 | 5/2006 | Mii et al. |
| 7,347,352 B2 | 3/2008 | Qin et al. |
| 2001/0005054 A1 | 6/2001 | Higashi et al. |
| 2001/0022315 A1 | 9/2001 | Tsai et al. |
| 2001/0042781 A1 | 11/2001 | Vitali et al. |
| 2003/0155405 A1* | 8/2003 | Takahashi .................. 228/180.5 |
| 2003/0155660 A1* | 8/2003 | Takahashi et al. ............ 257/777 |
| 2003/0166333 A1* | 9/2003 | Takahashi ..................... 438/617 |
| 2004/0026480 A1 | 2/2004 | Imai et al. |
| 2004/0104477 A1 | 6/2004 | Fujisawa |
| 2004/0152292 A1* | 8/2004 | Babinetz et al. ............. 438/617 |
| 2005/0072833 A1 | 4/2005 | Wong et al. |
| 2005/0189567 A1 | 9/2005 | Fujisawa |
| 2005/0258214 A1* | 11/2005 | Takahashi ..................... 228/101 |
| 2006/0032894 A1 | 2/2006 | Wong |
| 2006/0054665 A1* | 3/2006 | Calpito et al. ............. 228/180.5 |
| 2006/0151579 A1 | 7/2006 | Fujisawa et al. |
| 2006/0163331 A1* | 7/2006 | Babinetz ..................... 228/180.5 |
| 2006/0175383 A1 | 8/2006 | Mii et al. |
| 2006/0189117 A1* | 8/2006 | Takahashi et al. ............ 438/612 |
| 2006/0213956 A1 | 9/2006 | Yu |
| 2006/0255101 A1 | 11/2006 | Shirato et al. |
| 2007/0108256 A1 | 5/2007 | Mii et al. |
| 2007/0199974 A1 | 8/2007 | Babinetz et al. |
| 2007/0284416 A1 | 12/2007 | Wong et al. |
| 2008/0099895 A1 | 5/2008 | Kwak |
| 2008/0111252 A1 | 5/2008 | Qin et al. |
| 2008/0116591 A1 | 5/2008 | Hayashi et al. |
| 2008/0197510 A1 | 8/2008 | Mii et al. |
| 2009/0001608 A1 | 1/2009 | Mii et al. |
| 2010/0148369 A1* | 6/2010 | Mii et al. ....................... 257/773 |
| 2010/0206940 A1* | 8/2010 | Arahata et al. ............ 228/180.5 |
| 2010/0207280 A1* | 8/2010 | Mii et al. ....................... 257/784 |

FOREIGN PATENT DOCUMENTS

| | | |
|---|---|---|
| JP | 2004-247673 A * | 9/2004 |
| JP | 2005-019778 A | 1/2005 |
| JP | 2006-270096 A | 10/2006 |
| JP | 2008-235849 A * | 10/2008 |

* cited by examiner

| WIRE No. | LOOP HEIGHT | PULL STRENGTH | |
|---|---|---|---|
| | $\mu m$ | g f | MODE |
| 1 | 38.4 | 4.6 | B |
| 2 | 35.1 | 5.3 | B |
| 3 | 39.2 | 4.4 | B |
| 4 | 37.7 | 5.1 | B |
| 5 | 38.3 | 4.8 | B |
| 6 | 41.4 | 4.8 | B |
| 7 | 37.1 | 4.6 | B |
| 8 | 37.1 | 4.2 | B |
| 9 | 35.1 | 5.3 | B |
| 10 | 36.8 | 4.9 | B |
| AVE | 37.6 | 4.8 | |
| MAX | 41.4 | 5.3 | |
| MIN | 35.1 | 4.2 | |

FIG.11

WIRE BONDING METHOD, WIRE BONDING APPARATUS, AND WIRE BONDING CONTROL PROGRAM

CROSS-REFERENCE TO RELATED APPLICATION

The present application is a Continuation application of U.S. application Ser. No. 12/263,589 filed Nov. 3, 2008, now U.S. Pat. No. 7,748,599, which is incorporated herein by reference.

BACKGROUND OF THE INVENTION

1. Field of the Invention

The present invention relates to a wire bonding method, a wire bonding apparatus, and a wire bonding control program for connecting a first bonding point and a second bonding point with a wire and, more specifically, to a wire bonding method, a wire bonding apparatus, and a wire bonding control program which are able to form a low loop.

2. Description of the Related Art

In a semiconductor device having a semiconductor chip integrated therein or in a substrate having the semiconductor chip mounted directly thereon, a lower-loop wire for connecting a pad and a lead of the semiconductor chip has been developed for reducing the thickness thereof.

In JP-A-2004-172477, United States Unexamined Patent Publication No. 2007-284416, U.S. Pat. No. 7,347,352, and JP-A-2005-019778, lower-loop wires are disclosed.

JP-A-2004-172477 includes a first step of connecting a wire to a first bonding point, a second step of controlling the loop by a reverse movement of a capillary such as moving the capillary upward or horizontally, a third step of bonding the wire on a portion near the top of a joint ball at the first bonding point, and a fourth step of connecting the wire to the second bonding point by feeding the wire while controlling the loop by moving the capillary upward or horizontally toward a second bonding point.

According to the disclosure in the US-A-2007-284416, a ball bond 14 is formed, then, a bonding tool is moved upward from the ball bond, and then a neck portion is formed on the upper portion of the ball bond with a reverse movement to move a capillary 10 away from a second bonding point to bend a wire. Subsequently, the capillary 10 is moved toward the second bonding point to position a periphery of a distal end of the bonding tool on the neck portion, and press the neck portion by the periphery of the distal end of the bonding tool to form a depression (recess) on the neck portion without joining the neck portion to the ball bond. Therefore, the strength of the neck portion is maintained, and the lower loop is achieved.

According to the disclosure of U.S. Pat. No. 7,347,352, a bump is formed on a first bonding site, a bent portion of the wire in an oval shape is formed, a wire is then bonded on top of the bump, and a wire loop is formed between the top of the bump and a second bonding site, so that a wire having a low loop height is formed.

According to the JP-A-2005-019778, after having formed a contact-bonded ball 11, a capillary 5 is moved upward, is moved in the direction opposite from a second bond point B to make a reverse movement, and then is moved slightly downward. Subsequently, the capillary 5 is moved upward, is moved toward the second bond point B to a position where a lower surface 5a of the capillary 5, which is the opposite side from the second bond point B, is positioned above the contact-bonded ball 11, and is moved downward to press a wire 4 against the contact-bonded ball 11 to form a contact-bonding wire 12 and form a strong bent portion on the wire right above the contact-bonded ball, so that a lower loop wire is achieved.

In recent years, in association with the improvement of functions of mobile phones, digital AV apparatuses, IC cards, and so on, compact, low profile, and high integration semiconductor chips are demanded to be mounted thereon. In order to accommodate such demands, it is desired to realize a lower profile in a high-integration IC package (semiconductor device) in the field of wire bonding. In order to achieve the low profile of the IC package, it is necessary to reduce the loop height, and the loop height which is currently required is not more than two times the wire diameter. Therefore, formation of a low loop which satisfies the loop height not more than two times the wire diameter is needed in the wire bonding and, for example, when the wire diameter of 25 µm is employed, the loop height is required to be 50 µm or lower.

Normally, in order to form a contact-bonded ball on a pad as a first bonding point and move the wire right above the contact-bonded ball laterally to form the wire horizontally, a height of at least two times or more of the wire diameter from the neck portion of the contact-ball is needed. Accordingly, the height of the wire from the neck portion of the contact-bonded ball exceeds 50 µm in the case of the wire having a wire diameter of 25 µm.

FIG. 12 is a drawing showing an example of the shape of the wire loop disclosed in JP-A-2004-172477. The wire loop shown in FIG. 12 is formed in such a manner that a wire 35 assumes a low loop between a pad 31 as the first bonding point on a semiconductor chip (IC chip) 30 and a lead 33 as the second bonding point of a lead frame 32.

As shown in FIG. 12, the wire loop disclosed in JP-A-2004-172477 is configured in such a manner that the ball is brought into press-contact with the first bonding point and then the wire 35 is bent by a reverse movement or the like, so that the wire 35 is pressed against the first bonding point again. Therefore, the wire loop in JP-A-2004-172477 has a wire turnover portion 50 between a contact-bonded ball 51 and the wire 35 formed by turning over the wire 35. A height LH1 of the loop in the shape of the wire loop shown in FIG. 12 is the sum of a ball thickness T1, a thickness T2 of the wire turnover portion 50, a height T3 of a protrusion of the loop, and a wire diameter T4.

However, in a loop forming method disclosed in JP-A-2004-172477, it is difficult to keep the sum of the ball thickness T1, the thickness T2 of the wire turnover portion 50, and the height T3 of a protrusion of the loop not to exceed 25 µm using the wire having a diameter of 25 µm, and hence when the wire diameter T4 is added thereto, it is difficult to keep the value of LH1 not to exceed 50 µm. Therefore, further reduction of the height of the loop is desired.

The neck portion integrated with the upper portion of the ball bond is formed in the United States Patent Publication No. 2007-284416, the wire bent portion having an oval shape is formed in U.S. Pat. No. 7,347,352, and the strong bent portion is formed on the wire right above the contact-bonded ball in JP-A-2005-019778. According to these documents, since the wire is further pressed against the upper portion of the contact-bonded ball, it is difficult to keep the loop height not to exceed two times the wire diameter as in JP-A-2004-172477.

SUMMARY OF THE INVENTION

Accordingly, it is an object of the invention to provide a wire bonding method which enables formation of a low loop having a height not exceeding two times the wire diameter and secures sufficient pull strength of the wire even with the low-loop shape, a wire bonding apparatus and a wire bonding control program which realize the same.

In order to achieve the object as described above, a wire bonding method according to the invention is a wire bonding method for connecting a first bonding point and a second bonding point with a wire using a capillary including: contact-bonding a free air ball at a distal end of the capillary to the first bonding point to form a contact-bonded ball having a desired bonding thickness; moving the capillary upward after having formed the contact-bonded ball; and then pressing a side surface of the upper portion of the contact-bonded ball with the capillary while moving the capillary toward the second bonding point, to thereby form a top portion of the contact-bonded ball.

According to the wire bonding method in the invention, the opposite side from the second bonding point on the top portion of the contact-bonded ball is flat.

According to the wire bonding method in the invention, a protruded portion is formed on the side of the second bonding point on the top portion of the contact-bonded ball.

According to the wire bonding method in the invention, the protruded portion is formed by the capillary pressing the side surface of the upper portion of the contact-bonded ball with a chamfer surface or a bottom portion thereof while moving horizontally or downwardly toward the second bonding point.

According to the wire bonding method in the invention, the protruded portion is formed by applying ultrasonic oscillation to the capillary and causing the capillary to press the side surface of the contact-bonded ball while moving the capillary toward the second bonding point.

According to the wire bonding method in the invention, the protruded portion is formed by the capillary moving toward the second bonding point in such a manner that the ratio of the amount of downward movement of the capillary with respect to the amount of horizontal movement thereof falls within a range from 0 to 1 inclusive.

According to the wire bonding method in the invention, a wire drawing portion for drawing a wire horizontally from the top portion of the contact-bonded ball is formed by the capillary moving upward after having formed the protruded portion and, after having moved upward, moving downward while moving toward the second bonding point, and pressing the upper portion of the protruded portion.

According to the wire bonding method in the invention, the wire drawing portion is formed by the capillary moving downward while moving toward the second bonding point to shape the upper portion of the protruded portion and pressing the upper surface of the wire delivered therefrom during the movement.

According to the wire bonding method in the invention, the wire drawing portion is formed by applying ultrasonic oscillation to the capillary while moving the capillary toward the second bonding point.

According to the wire bonding method in the invention, the wire drawing portion is formed by moving the capillary downward while moving it toward the second bonding point in such a manner that the ratio of the amount of downward movement of the capillary with respect to the amount of horizontal movement thereof becomes one or more.

According to the wire bonding method in the invention, the capillary is controlled to make the sum of a value obtained by subtracting the amount of downward movement of the capillary from the amount of upward movement thereof during the formation of the protruded portion, a value obtained by subtracting the amount of downward movement of the capillary from the amount of upward movement thereof during the formation of the wire drawing portion, and the desired thickness of contact bonding of the ball in the formation of the contact-bonded ball not to exceed a intended loop height.

According to the wire bonding method in the invention, after having formed the wire drawing portion, the wire is strained by moving the capillary upward toward the second bonding point, then making the reverse movement, that is, moving the capillary in an opposite direction from the second bonding point, for making the wire to maintain its shape, then moving the capillary toward the second bonding point, and then bonding the wire to the second bonding point.

According to the wire bonding method in the invention, the wire is strained so as to extend substantially horizontally from the side surface of the wire drawing portion on the top portion of the contact-bonded ball toward the second bonding point.

The reverse movement in the wire bonding method in the invention includes at least one of the reverse movements such as moving the capillary horizontally, moving linearly downward, moving downward along an arcuate trajectory, moving linearly upward, and moving upward along an arcuate trajectory, and the reverse movement is repeated by n times (n=1, 2, . . . ).

A wire bonding apparatus according to the invention is a wire bonding apparatus for connecting a first bonding point and a second bonding point with a wire using a capillary, further including a wire drawing portion on the side of the second bonding point of a top portion formed on a contact-bonded ball which is contact-bonded to the first bonding point.

According to the wire bonding apparatus in the invention, the opposite side from the second bonding point on the top portion of the contact-bonded ball is flat.

A wire bonding apparatus according to the invention is a wire bonding apparatus for connecting a first bonding point and a second bonding point with a wire using a capillary including; an XY positioning unit that positions the capillary at a predetermined position on an XY plane; and a bonding unit having a capillary elevating unit that moves the capillary in the vertical direction and performing a bonding operation at the first bonding point and the second bonding point, in which the bonding unit contact-bonds a ball at the distal end of the capillary to the first bonding point and forms a contact-bonded ball, the capillary elevating unit moves the capillary upward after having formed the contact-bonded ball, the capillary elevating unit and the XY positioning unit cause the capillary after having moved upward to press a side surface of the upper portion of the contact-bonded ball while moving toward the second bonding point, and form a protruded portion on the top portion of the contact-bonded ball on the side of the second bonding point.

According to the wire bonding apparatus in the invention, after having formed the protruded portion, the capillary elevating unit moves the capillary upward, the capillary elevating unit and the XY positioning unit cause the capillary after having moved upward to move downward while moving toward the second bonding point to press the upper portion of the protruded portion, so that the wire drawing portion is formed for drawing the wire horizontally from the top portion of the contact-bonded ball.

A wire bonding control program according to the invention is a wire bonding control program for a wire bonding apparatus for connecting a first bonding point and a second bonding point with a wire using a capillary having an XY positioning unit that positions the capillary at a predetermined position on an XY plane, a capillary elevating unit that moves the capillary in the vertical direction, a bonding unit that performs a bonding operation at the first bonding point and the second bonding point, and a control unit that controls the XY positioning unit and the bonding unit, including: a ball contact-bonding step for contact-bonding a ball at a distal end of the capillary to the first bonding point by the bonding unit; and a first pressing step for moving the capillary upward by the capillary elevating unit after having formed the contact-bonded ball and pressing a side surface of the upper portion of the contact-bonded ball while moving the capillary after having moved upward toward the second bonding point by the capillary elevating unit and the XY positioning unit, and forming a protruded portion on the top portion of the contact-bonded ball on the side of the second bonding point.

The wire bonding program in the invention further includes a second pressing step for forming a wire drawing portion for drawing the wire horizontally from the top portion of the contact-bonded ball by moving the capillary upward by the capillary elevating unit, and causing the capillary after having moved upward to move downward while moving toward the second bonding point by the capillary elevating unit and the XY positioning unit to press the upper portion of the protruded portion after the first pressing step.

In the wire bonding in the related art, a wire turnover portion or the like is formed for securing the sufficient pull strength of the wire and the wire turnover portion or the like is placed over the contact-bonded ball. Therefore, the thickness is increased correspondingly, and it is difficult to form a loop having the height not exceeding two times the ball wire diameter. However, according to the invention, reduction of the height of the loop right above the first bonding point is achieved while securing the sufficient pull strength of the wire.

In other words, according to the invention, since the capillary presses the side surface of the contact-bonded ball at the first bonding point while moving downward toward the second bonding point, a force in the horizontal direction applied to the contact-bonded ball is reduced and an influence on the joint between the pad and the contact-bonded ball is negligible, so that the joint strength between the pad and the contact-bonded ball is maintained and, in addition, formation of the loop having the height not exceeding two times the wire diameter is achieved.

According to the invention, the cross sectional area at the joint portion between the contact-bonded ball at the first bonding point and the neck portion of the wire is increased, and the strength required at the neck portion of the wire is maintained.

BRIEF DESCRIPTION OF THE DRAWINGS

FIG. 11 is a diagram showing a result of measurement of the loop height and the pull strength;

DESCRIPTION OF THE PREFERRED EMBODIMENTS

Figure 1:
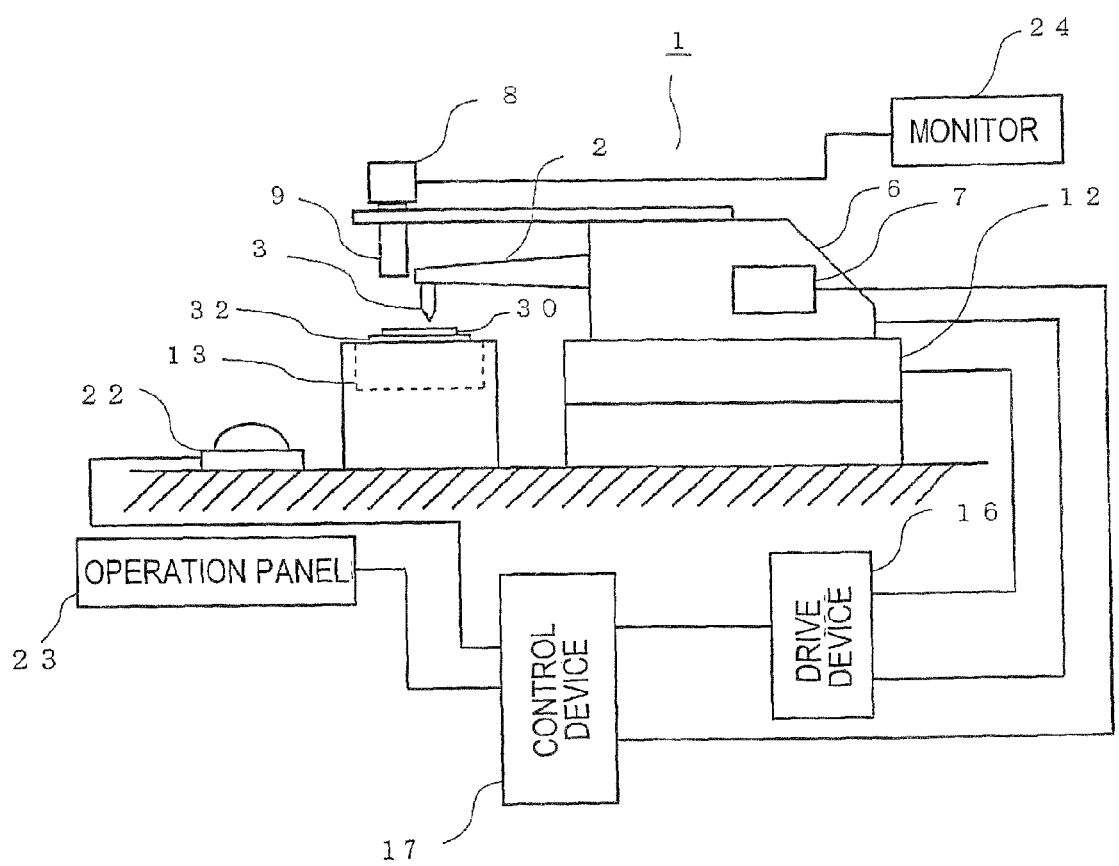
FIG. 1 is a block diagram showing a configuration of a wire bonding apparatus.

Referring now to the drawings, best modes for implementing a wire bonding method, a wire bonding apparatus, and a wire bonding control program according to the invention will be described. The invention is adapted to provide two pressing steps; the first pressing step is moving the capillary downward toward a second bonding point after bonding a ball on the first bonding point and then moving the capillary upward to press a side surface of the ball obliquely, and the second pressing step is moving the capillary downward toward the second bonding point after having moved it upward by a predetermined amount following the first bonding step to press the wire obliquely, so that further reduction in the height of a loop is achieved and a sufficient wire pull strength is achieved even in such a low-loop shape.

Figure 2:
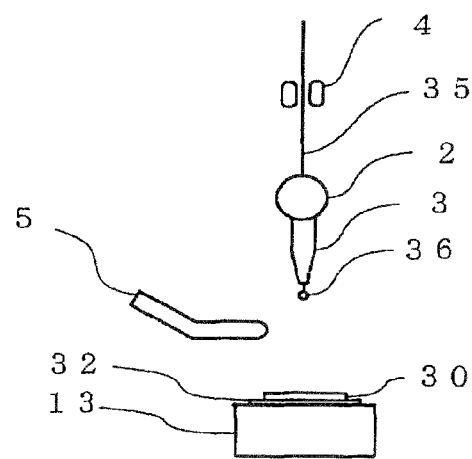
FIG. 2 is an explanatory drawing showing a positional relationship among a capillary, a clamper, and an EFO (Electric Flame Off) of the wire bonding apparatus shown in FIG. 1.

Referring now to FIG. 1 and FIG. 2, a configuration of a wire bonding apparatus will be described. FIG. 1 is a block diagram showing a configuration of a wire bonding apparatus, and FIG. 2 is an explanatory drawing showing the positional relationship among a capillary, a clamper, and an EFO (Electric Flame Off) of the wire bonding apparatus shown in FIG. 1.

As shown in FIG. 1, a wire bonding apparatus 1 includes a camera 8 as an image pickup unit having an optical lens 9 mounted thereon, a monitor 24 that displays a video signal from the camera 8, a bonding arm 2 including an ultrasonic hone having a capillary 3 as a bonding tool mounted on a distal end thereon, a bonding head 6 having a linear motor (not shown) as a driving unit that drives the bonding arm 2 in the vertical direction, that is, in the Z-direction, an XY table 12 as an XY positioning unit that loads a bonding means having the bonding arm 2 and the bonding head 6, and the image pickup unit, moves the same relatively and two-dimensionally in the X-direction and the Y-direction, and positions the same, a heater unit 13 for mounting a semiconductor chip 30 for a bonding operation performed by the capillary 3, the bonding arm 2 and the bonding head 6 and having a heater plate on a counter thereof, a control device 17 having a microcomputer for controlling the entire wire bonding apparatus 1, and a drive device 16 that emits a drive signal to the bonding head 6 and the XY table 12 in response to a command signal from the control device 17. A storage device of the microcomputer of the control device 17 includes a program built therein, and the operation of the wire bonding or the like is performed by implementing the program. A lead frame 32 on which the semiconductor chip 30 is mounted is mounted on the heater plate of the heater unit 13, and is heated by a heater of the heater unit 13.

The wire bonding apparatus 1 includes an operation panel 23 having numerical value entering keys and operating switches for enabling input and output of data such as parameters and display of the data for operation in addition to a control unit 22 including a track ball which enables manual movement of the XY table 12. The control unit 22 and the operation panel 23 are collectively referred to as an operating unit, hereinafter. The wire bonding apparatus is operated manually or automatically by the operation of the operating unit.

[Functions of Principal Apparatus]

The bonding head 6 which drives the bonding arm 2 vertically in the Z-direction includes a position detection sensor 7 for detecting the position of the bonding arm 2, and the position detection sensor 1 is adapted to output the position of the capillary 3 mounted to the distal end of the bonding arm 2 from the position of a preset original point of the bonding arm 2 to the control device 17. The linear motor of the bonding head 6 drives the bonding arm 2 vertically by the control device 17, and also the magnitude and the duration of a load to be applied to the capillary 3 at the time of bonding are controlled.

The wire bonding apparatus 1 includes an ultrasonic oscillator (not shown), and is adapted to apply a voltage to a piezoelectric transducer built in an ultrasonic horn 2, cause the capillary 3 positioned at the distal end of the ultrasonic horn 2 to generate oscillations, and apply the ultrasonic oscillations and the load to the capillary 3 upon reception of a control signal from the control device 17.

Formation of a ball at the distal end of the capillary 3 is achieved in such a manner that a high voltage is applied between the distal end of the wire feeding from the capillary 3 and an EFO (Electric Flame Off) (torch rod) upon reception of the control signal from the control device 17 to cause discharge, and the distal end portion of the wire is melted by the discharge energy thereof to form a ball at the distal end of the wire inserted into the capillary 3. The ball formed at the distal end of the wire is also referred to as a free air ball (FAB).

The control device 17 of the wire bonding apparatus 1 stores the XY position data of the bonding point required for bonding. In other words, the control unit 22 shown in FIG. 1 is operated to align an intersection of a cross sign displayed at the center of a display screen of a monitor 24 for displaying images taken by the camera 8 to the center of the pad as the first bonding point, and also to the position on the lead as the second bonding point. The positions of an X-axis and a Y-axis of an XY table 12 at the aligned position are stored in the control device 17 as a coordinate of the bonding point. By the movement of the XY table 12 by an amount corresponding to the distance (offset) between the position of the optical lens 9 and the position of the capillary 3, the capillary 3 is positioned above the position of alignment with the camera 8.

The wire bonding apparatus 1 shown in FIG. 1 connects the pad on the semiconductor chip 30 and the lead such as a lead frame with a wire such as a gold wire while heating the lead frame. The connection of the wire with the pad or the lead is achieved by applying the ultrasonic oscillations and the load on the capillary 3 as the bonding tool.

The capillary 3 positioned at the distal end of the bonding arm 2 of the bonding head 6 mounted on the XY table 12 is adapted to be movable to a position on the XY-axes by the XY table 12 and to a position on the Z-axis by the bonding head 6. However, a configuration in which the bonding head 6 is fixed to a main body, the heater unit 13 for mounting a bonded part is mounted on the XY table 12, the bonding head moves only vertically in a Z-axis direction, the bonded part is mounted on the XY table, and the bonded part moves relatively and two dimensionally on the XY-axes with respect to the capillary is also applicable.

As shown in FIG. 2, a clamper 4 moves in conjunction with the vertical movement of the bonding arm 2 (shown in FIG. 1) for clamping or releasing a wire 35 by an opening and closing mechanism (not shown), and is controlled by the control device 17. The wire 35 passes between clamping surfaces of the opening and closing mechanism of the clamper 4, then passes through a hole provided in the capillary 3, and is fed from the distal end of the capillary 3. An EFO (Electric Flame Off) 5 is provided below the capillary 3 so that electric discharge therefrom forms a free air ball 36 at the distal end of the wire 35 fed from the distal end of the capillary 3.

The configuration of the wire bonding apparatus shown in FIG. 1 and FIG. 2 is a general configuration, and the invention is not limited thereto.

Figure 3:
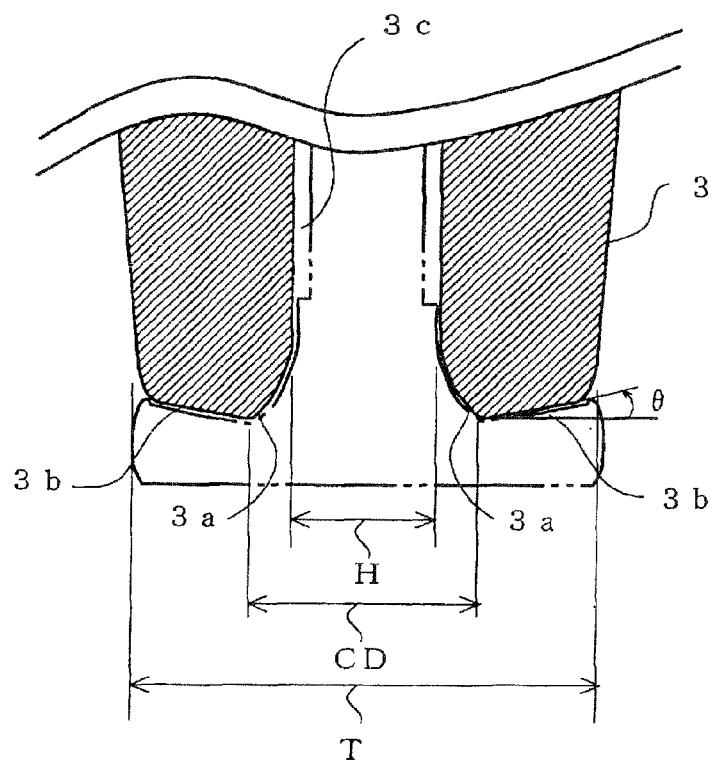
FIG. 3 is a cross-sectional view showing the shape of a lower portion of the capillary.
Figure 4:
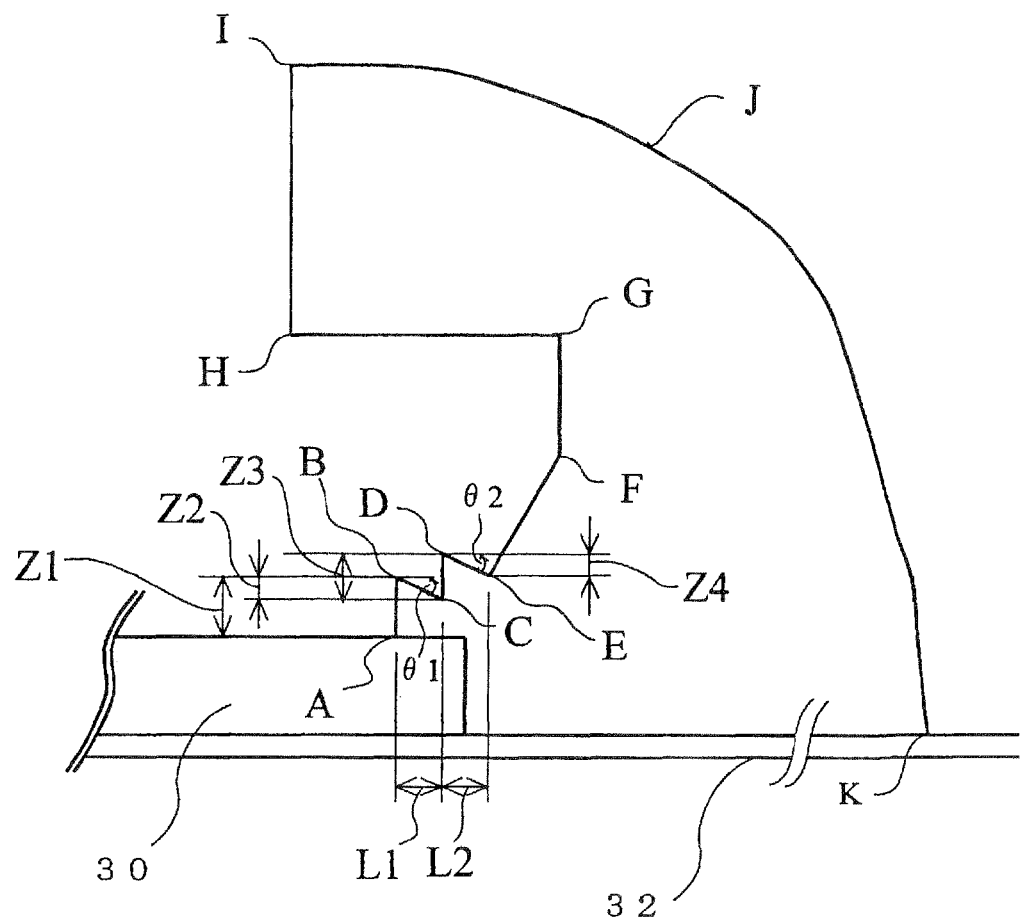
FIG. 4 is a drawing showing a trajectory of movement of the capillary in formation of a loop.

Referring now to FIG. 3 to FIG. 7, an embodiment of low-loop formation by the wire bonding method in the invention will be described. FIG. 3 is a cross-sectional view showing the shape of a lower portion of the capillary; FIG. 4 is a drawing showing a trajectory of the capillary in the loop formation; FIG. 5A to FIG. 5K are drawings showing shapes of contact-bonding of the ball and the shapes of the wire at respective time points along the trajectory of the capillary; FIG. 6A to FIG. 6H are drawings partly in cross section showing the shapes of the contact-bonding of the ball shown in FIG. 5A to FIG. 5G in detail; and FIG. 7A to FIG. 7D are drawings partly in cross-section showing the shapes of the contact-bonding of the ball shown in FIG. 5H to FIG. 5K in detail.

First of all, the shape of the capillary used for wire bonding will be described. As shown in FIG. 3, the capillary 3 has a hole 3c for allowing passage of the wire, and has a space of a substantially truncated conical shape being widened downward from the hole 3c (hereinafter, referred to as a truncated cone). The diameter of an upper plane of the space of the truncated conical shape is indicated by a hole diameter H, the diameter of the inner end of a bottom portion 3b is indicated by a chamfer diameter CD, and the periphery of the space of the truncated conical shape is surrounded by a chamfer surface 3a. When the chamfer surface 3a is oriented vertically, it has a column-shaped space. Therefore, the truncated cone includes from the substantially truncated conical shape to the column shape.

The bottom portion 3b of the capillary 3 extends at an angle θ with respect to the horizontal direction from the inner bottom portion of the bottom portion 3b toward the periphery of the capillary 3, as shown in FIG. 3. Normally, the angle θ is 4° or 8°. The bottom portion 3b may be a flat surface having an angle θ of 0°. When the diameter of the periphery of the bottom portion 3b of the capillary is expressed by T, the length from the chamfer diameter to the periphery of the bottom portion 3b of the capillary 3 in the horizontal direction is (T−CD)÷2. The bottom portion 3b of the capillary 3 presses the free air ball 36 against the pad at the first bonding point, or presses the wire 35 against the lead at the second bonding point. In the invention, it is also used in a first pressing process for pressing a side surface of the contact-bonded ball after having contact-bonded the ball at the first bonding point and a second pressing process for forming a wire drawing portion after the first pressing process, which will be described later. A double-dashed line shown in FIG. 3 indicates the state of the contact-bonded ball formed inside and the bottom portion 3b of the capillary 3 by pressing the free air ball 36.

Figures 5A, 5B, 5C, 5D:
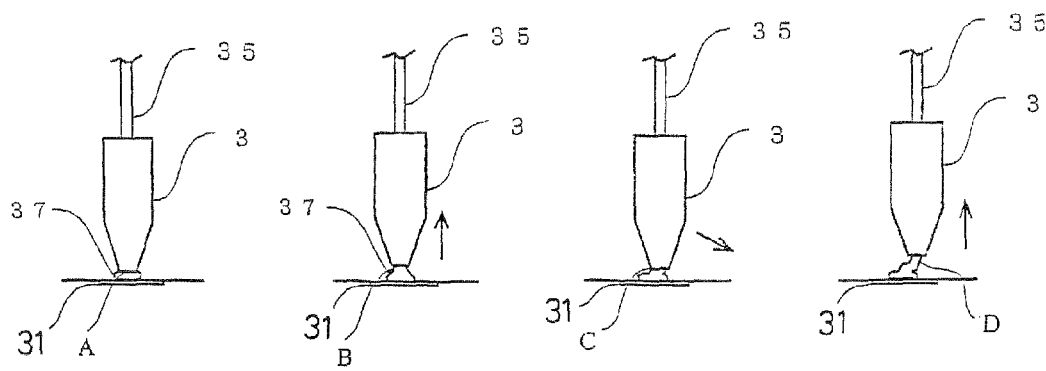
FIG. 5A to FIG. 5K are drawings showing shapes of contact bonding of a ball and the shapes of a wire at respective time points along the trajectory of movement of the capillary.

Subsequently, the wire bonding method for forming a low loop by controlling the capillary described above will be described. Arrows shown in FIG. 5 to FIG. 7 indicate the direction of movement of the capillary. As shown in FIG. 4, FIG. 5A and FIG. 6A, first of all, the clamper 4 (shown in FIG.

2) which clamps the wire 35 is in an opened state, and the capillary 3 moves downward from above the pad 31 as the first bonding point and bonds the free air ball 36 (shown in FIG. 2) formed at the distal end of the wire 35 to a point A of the pad 31 as the first bonding point. As shown in the FIG. 6A, the free air ball 36 at the distal end of the capillary 3 is deformed by being pressed against the pad by the bottom portion 3*b* of the capillary 3, and is filled into the space of the truncated conical shape defined by the chamfer surface 3*a* of the capillary 3. The free air ball pressed by the capillary 3 is referred to as a contact-bonded ball 37. A neck portion 42 positioned on an upper portion of the contact-bonded ball 37 is present in the interior of the capillary 3 as shown in the FIG. 6A. The space defined by the chamfer surface 3*a* of the capillary 3 is not limited to the truncated cone as described above, and may be a space of a column shape depending on the shape of the chamfer surface 3*a*.

Figure 6A:
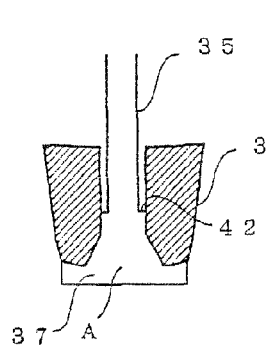
FIG. 6A to FIG. 6H are drawings showing the shapes of contact bonding of the ball shown in FIG. 5A to FIG. 5G partly in cross section.
Figure 6B:
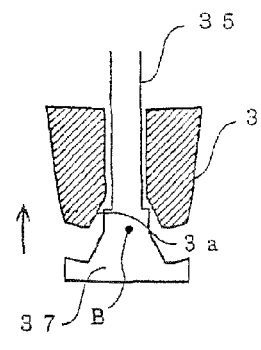

Subsequently, as shown in FIG. 4, FIG. 5B and FIG. 6B, the clamper 4 is in the opened state, and moves the distal end of the capillary 3 vertically upward to a point B. As shown in the FIG. 6B, the chamfer surface 3*a* of the capillary 3 is positioned facing the side surface of the upper portion of the truncated conical shape of the contact-bonded ball 37 by being moved upward to the point B indicated by a dot. The positional control of the point B is done by the command from the control device 17 by drive-controlling the bonding head 6 with respect to the Z-axis direction, and in contrast, the drive control in the XY direction thereof is done by drive-controlling the XY table 12 by the control device 17. A description will be given below on the basis of such the driving control. The shape of the contact-bonded ball 37 is not limited to the truncated cone, but depends on the shape of the chamfer surface 3*a* of the capillary 3, and hence the invention is applicable to the contact-bonded ball 37 in other shapes.

Figure 6C:
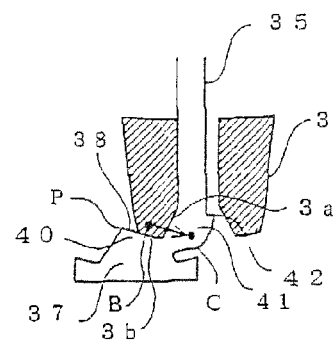

As shown in FIG. 4, FIG. 5C and FIG. 6C, the capillary 3 is moved downward from the position of the point B described above to a point C on the side of a point K as the second bonding point. At this time, as shown in the FIG. 60, the chamfer surface 3*a* and the bottom portion 3*b* of the capillary 3 move downward from the point B indicated by a dot to the point C indicated by a dot on the side of the second bonding point while pressing obliquely the side surface of the upper portion of the contact-bonded ball 37 formed into the truncated conical shape including the neck portion 42. The side surface of the upper portion of the contact-bonded ball 37 means a side surface of the truncated cone of the contact-bonded ball 37 and a side surface of a portion formed into a column shape from the upper portion of the truncated cone of the contact-bonded ball 37 to the neck portion 42, or the side surface of the truncated cone of the contact-bonded ball 37 or the side surface of the portion formed into a column shape from the upper portion of the truncated cone of the contact-bonded ball 37 to the neck portion 42. With this downward movement, the bottom portion 3*b* of the capillary 3 on the opposite side from the second bonding point is positioned on the upper portion of the contact-bonded ball 37. A step in which the capillary 3 moves from the point A to the point C is referred to as a first pressing process.

In the first pressing process, a protruded portion 41 having the neck portion 42 of the contact-bonded ball 37 is formed on the side of the second bonding point of a top portion 38 (shown in the in FIG. 6C and FIG. 7D) of the contact-bonded ball 37. Accordingly, the neck portion 42 which has been positioned at the center of the contact-bonded ball 37 is positioned on the side of the second bonding point of the top portion 38 of the contact-bonded ball 37 by the first pressing process. Also, a flat portion 40 having a gentle inclination toward the second bonding point is formed on the top portion 38 of the contact-bonded ball 37 of the first bonding point on the side opposite from the second bonding point. When the bottom portion 3*b* of the capillary 3 has a flat shape, the flat portion 40 of the top portion 38 of the contact-bonded ball 37 is formed horizontally. Reference sign P at the end portion of the flat portion 40 shown in the FIG. 6C is shown for indicating clearly an identical position in the following description. The reference numeral P is used in FIG. 7, FIG. 9, and FIG. 10.

When moving the capillary 3 downward from the point B to the point C in the first pressing process, it is also possible to excite the piezoelectric transducer of the ultrasonic hone 2 as the bonding arm 2 to provide oscillation to the capillary. By oscillating the capillary 3, formation of the flat portion 40 and the protruded portion 41 of the top portion 38 of the contact-bonded ball 37 is ensured.

In FIG. 4, FIG. 5C and FIG. 6C, the capillary 3 is moved downward from the position of the point B in the first pressing process to the point C on the side of the point K as the second bonding point. In an alternative embodiment, however, the capillary 3 may be moved horizontally from the point B to the point C. More specifically, the height of the point B in FIG. 4 may be the same height as the point C in FIG. 4, and the distal end of the capillary 3 may be moved vertically upward to the point B, and then be moved horizontally from the point B to the point C. In other words, the pressing movement is not limited as long as it applies a pressing load required to form the protruded portion 41.

Figure 6D:
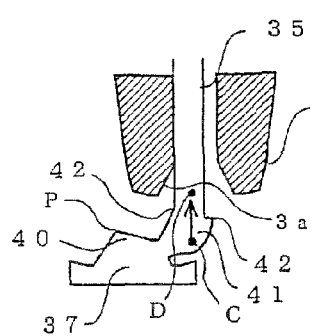

Subsequently, as shown in FIG. 4, FIG. 5D and FIG. 6D, the distal end of the capillary 3 is moved upward from the point C to the point D. Accordingly, as shown in the FIG. 6D, by the upward movement of the capillary 3 from the point C indicated by a dot to the point D indicated by a dot, the chamfer surface 3*a* of the capillary 3 on the side opposite from the second bonding point is positioned near the neck portion 42 on the side opposite from the second bonding point of the protruded portion 41. At this time, as shown in the FIG. 6D and FIG. 4, the position of the point D is higher than the position of the point B.

Figures 5E, 5F, 5G, 5H:
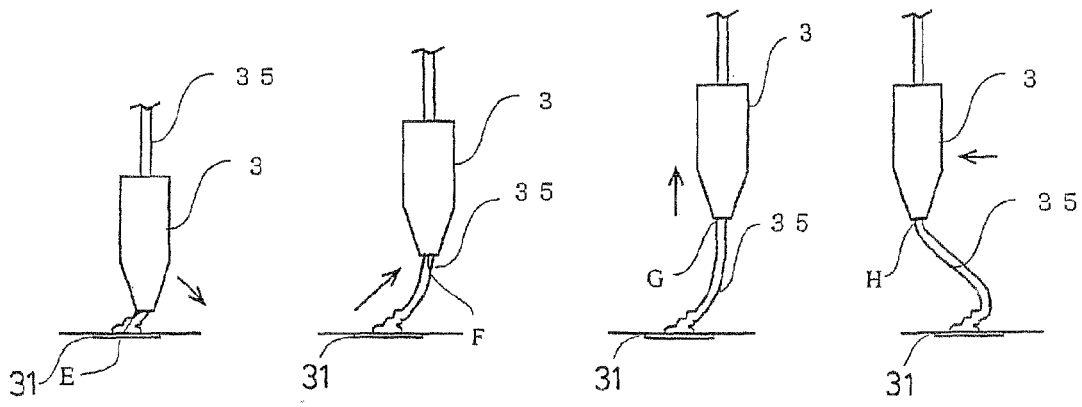
Figure 6E:
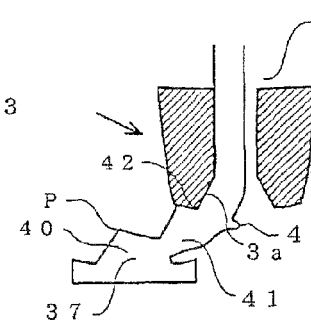
Figure 6F:
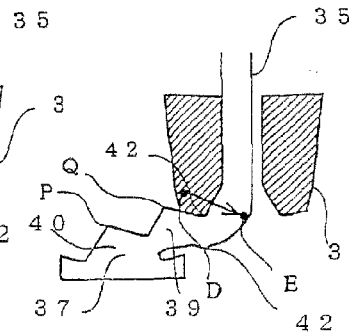

As shown in FIG. 4, FIG. 5E and FIG. 6F, the capillary 3 is moved downward to a point E on the side of the point K as the second bonding point. As shown in the FIG. 6F, the capillary 3 moves downward from the point D indicated by a dot to the point E indicated by a dot. The FIG. 6E shows an intermediate state of the capillary 3 in the course of moving from the point D shown in the FIG. 6D to the point E shown in the FIG. 6F. At this time, as shown in the FIG. 6E, the chamfer surface 3*a* of the capillary 3 moves downward to the side of the second bonding point while pressing the protruded portion 41 having the neck portion 42 and the wire 35 obliquely. A step in which the capillary 3 moves from the point C to the point E is referred to as the second pressing process.

In the second pressing process, the protruded portion 41 is shaped and a wire drawing portion 39 for drawing the wire 35 horizontally from the top portion 38 of the contact-bonded ball 37 is formed. By the second pressing process, the wire 35 extended vertically from the neck portion 42 of the protruded portion 41 is then extended from the side surface of the wire drawing portion 39, and the neck portion 42 is positioned on the side surface of the wire drawing portion 39 on the side of the second bonding point. The cross-sectional area of the neck portion 42 of the wire drawing portion 39 is larger than the cross-sectional area of the wire 35 since the protruded portion 41 is pressed by the capillary 3. Therefore, a required strength at the neck portion is maintained.

The capillary 3 is moved downward from the point D to the point E so that the position of the point E in the second pressing process becomes an intended loop height described later.

When moving the capillary 3 downward from the point D to the point E, it is also possible to excite the piezoelectric transducer of the ultrasonic hone 2 as the bonding arm 2 to provide oscillation to the capillary. By oscillating the capillary 3, formation of the wire drawing portion 39 is ensured. Reference sign Q at the end portion of the wire drawing portion 39 shown in the FIG. 6F is shown for indicating clearly an identical position in the following description. The reference numeral Q is used in FIG. 7, FIG. 9, and FIG. 10.

Figure 6G:
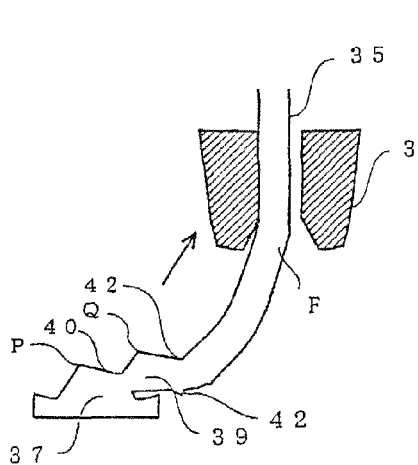

Then, as shown in FIG. 4, FIG. 5F and FIG. 6G, the capillary 3 moves upward to a point F while moving obliquely toward the second bonding point. As shown in the FIG. 6G, the capillary 3 moves upward to the point F while moving toward the second bonding point to feed the wire 35 from the capillary 3 so that the wire from the wire drawing portion 39 can extend linearly.

Figures 5I, 5J, 5K:
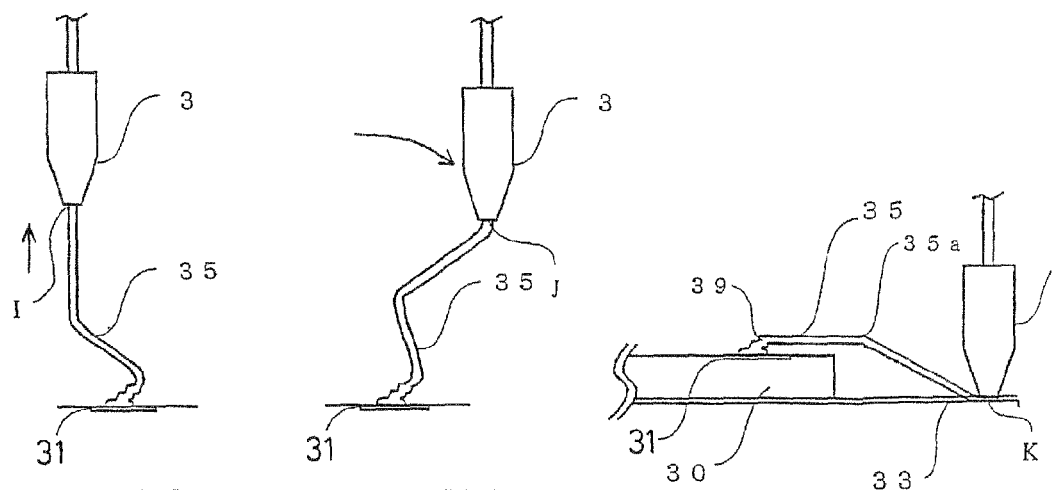
Figure 6H:
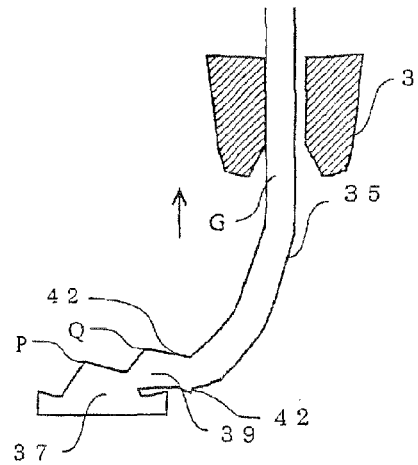
Figures 7A, 7B, 7C:
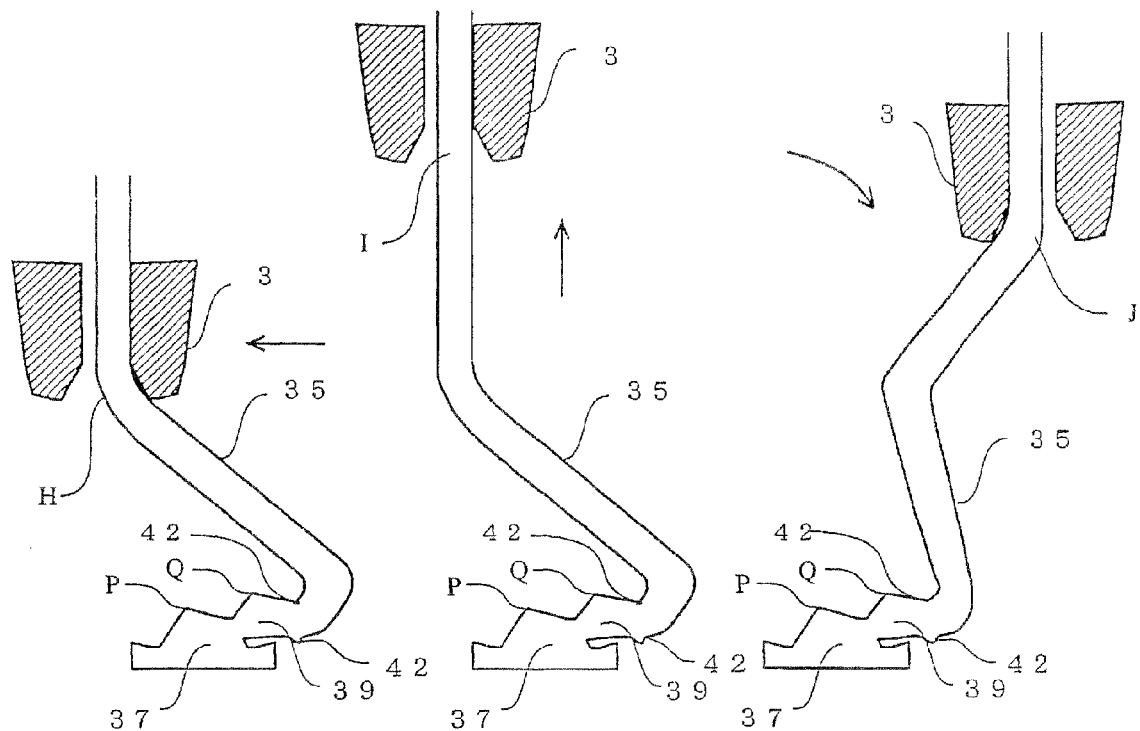
FIG. 7A to FIG. 7D are drawings showing the shapes of contact bonding of the ball shown in FIG. 5H to Fig. K partly in cross section.
Figure 7D:
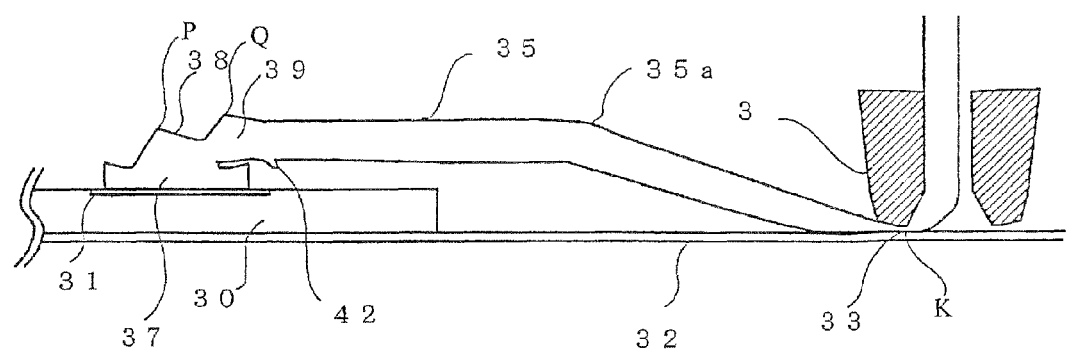

Subsequently, as shown in FIG. 4, FIG. 5G and FIG. 6H, the capillary 3 moves vertically upward to a point G. Then, as shown in FIG. 4, FIG. 5H and FIG. 7A, the capillary 3 moves horizontally from the point G to the side opposite from the second bonding point to make a reverse movement, and moves to the point H. With the reverse movement, the wire 35 is formed with a bent portion 35a (shown in the FIG. 5K and FIG. 7D), that is, a point H. After having moved to the point H as the bent portion 35a shown in FIG. 4, the capillary 3 moves vertically upward to the point I as shown in FIG. 4, FIG. 5I and FIG. 7B. After having moved upward to a point I, as shown in FIG. 4, FIG. 5J and FIG. 7C, the capillary 3 moves downward so as to draw an arc toward the second bonding point through the point J. Then, as shown in FIG. 4, FIG. 5K and FIG. 7D, the capillary 3 comes into contact with the point K as the second bonding point, and joins the wire 35 to a lead 33 at the second bonding point. Accordingly, as shown in FIG. 5K, a wire loop is formed between the first bonding point and the second bonding point.

After having joined the wire to the lead 33 at the second bonding point, the capillary 3 moves upward for delivering the wire 35 from the distal end thereof, the clamper 4 is closed at a predetermined position, the wire 35 is torn from the second bonding point, and then a high voltage is applied to the EFO (Electric Flame Off) 5 (shown in FIG. 2) to form a next free air ball 36 at the distal end of the wire 35.

In the reverse movement from the point G to the point H, the capillary is moved horizontally. As other modes of the reverse movement, it can be moved obliquely and linearly downward, obliquely downward along an arcuate trajectory, obliquely and linearly upward, or obliquely upward along an arcuate trajectory. The bent portion (35a) of the wire 35 is kept in the folded shape by moving the capillary 3 obliquely and linearly downward or obliquely downward along the arcuate trajectory, and the bent portion (35a) of the wire 35 is kept in the curved shape by moving the capillary 3 obliquely and linearly upward or obliquely upward along the arcuate trajectory. An optimal reverse movement is selected from among the various reverse movements described above as the reverse movement in the loop formation. The reverse movement is repeated by n times (n=1, 2, . . . ) by combining the various reverse movements described above between the point F to the point H. For example, when the first bonding point and the second bonding point are apart from each other, the wire length is increased, and hence wire sagging may occur in the case of the low loop. Therefore, by making the reverse movement as needed, occurrence of the wire sagging is prevented. In the semiconductor chip, more specifically, in the IC chip, the length for maintaining the wire horizontally from the first bonding point may vary from wire to wire, and hence the type of the reverse movement, the position to make the reverse movement, and the number of times of the reverse movement are set according to the loop shape of each wire.

The downward movement of the capillary from the point I to the point K as the second bonding point shown in FIG. 4 may be movements other than the arcuate movement. For example, the capillary may be moved downward along trajectories such as a straight line, Bezier curve, a spline curve, or a double-arc. It is also possible to use the movements described above in combination.

The low loop wire shape as shown in FIG. 5K and FIG. 7D is formed by moving the capillary from the point. A to the point K described thus far shown in FIG. 4. As shown in FIG. 7D, the wire 35 is linearly drawn from the wire drawing portion 39 formed at the top portion 38 of the contact-bonded ball 37 at the first bonding point, so that the wire 35 becomes parallel to the semiconductor chip 30 as the bonded part.

In this manner, the present invention includes two pressing steps. In the first pressing step, the capillary moves downward while moving toward the second bonding point and presses the side surface of the upper portion of the contact-bonded ball 37 including the neck portion 42 obliquely to form the protruded portion 41 having the neck portion 42 of the contact-bonded ball 37 on the side of the second bonding point of the top portion 38 of the contact-bonded ball 37. In the second pressing step, the capillary moves downward while moving toward the second bonding point and presses the protruded portion 41 having the neck portion 42 to form the wire drawing portion 39 for drawing the wire horizontally from the top portion 38 of the contact-bonded ball 37. Therefore, according to the embodiment of the invention, since it is not necessary to provide a wire turnover portion by making the reverse movement after having contact-bonded the ball at the first bonding point to bend the wire and pressing the wire again against the first bonding point unlike the related art, reduction of the height of the contact-bonded ball at the first bonding point is achieved.

Subsequently, the amount of upward movement, the amount of downward movement, and the amount of horizontal movement of the capillary from the point B to the point E after having contact-bonded the ball at the point A as the first bonding point shown in FIG. 4 will be described respectively. The amount of movement from the point in the three-dimensional space in X, Y, and Z axes is specified when moving the capillary. As shown in FIG. 4, the amount of upward movement of the capillary from the point A to the point B is expressed by Z1, the amount of downward movement of the capillary from the point B to the point C is expressed by Z2, the amount of upward movement of the capillary from the point C to the point D is expressed by Z3, the amount of downward movement of the capillary from the point D to the point E is expressed by Z4, the amount of XY movement of the capillary from the point B to the point C is expressed by L1, and the amount of XY movement of the capillary from the point C to the point E is expressed by L2. The intended loop height is not to exceed two times the wire diameter. In the description given below, the position from the point B to the point E is determined on the basis of the position where the capillary forms the contact-bonded ball at the first bonding point.

For example, a case in which the wire diameter is 25 μm, the diameter of contact bonding is 60 μm, the thickness of contact bonding is 10 μm, and the intended loop height is 40 μm which satisfies the loop height not exceeding two times the wire diameter will be described. The thickness of contact bonding is the thickness of the flange shape formed around the ball when contact bonding the ball, which is expressed by the distance from the surface of the pad to the bottom portion 3b of the capillary 3 at the time of joining the ball. The data of the thickness of contact bonding and the diameter of contact bonding described above is intended values (desired values) with respect to the thickness of contact bonding and the diameter of contact bonding obtained actually by the bonding operation, and the size of the free air ball 36 (shown in FIG. 2) to be formed, the power and the duration of the ultrasonic wave to be applied to the piezoelectric transducer of the ultrasonic horn 2 at the time of bonding at the first bonding point, the magnitude and the duration of the load applied by the linear motor of the bonding head 6 are set so as to achieve the intended thickness and diameter of contact bonding in advance.

First of all, the amount of XY movement L1 of the capillary in the movement from the point B to the point C on the side of the second bonding point is determined. This XY movement is made for forming the protruded portion 41 having the neck portion 42 of the contact-bonded ball 37 of the first bonding point on the side of the second bonding point of the top portion 38 of the contact-bonded ball 37, and for forming the flat portion 40 having a gentle inclination toward the second bonding point on the top portion 38 of the contact-bonded ball 37 on the side opposite from the second bonding point. Therefore, the amount of XY movement L1 is set to be an amount of movement required for forming these portions. For example, the amount of XY movement L1 is determined to be 30 μm which corresponds to half a diameter of 60 μm, which is the diameter of contact bonding.

The amount of upward and downward movement of the capillary is controlled to satisfy the expression (1) shown below.

$$(Z1-Z2)+(Z3-Z4)+\text{thickness of contact bonding}=\text{intended loop height} \quad (1)$$

The amount of upward movement Z1 and the amount of downward movement Z2 of the capillary are determined in such a manner that the height (Z1-Z2) at the point C shown in FIG. 4 becomes about a half the intended loop height, which is 20 μm. Therefore, the amount of upward movement Z1 is determined to be 40 μm, and the amount of downward movement Z2 is determined to be 20 μm. The movement from the point B to the point C is achieved by making the downward movement and the XY movement simultaneously, and is controlled to cause the capillary to move linearly. The movement from the point B to the point C is made so that the ratio of the amount of downward movement Z2 of the capillary with respect to the amount of XY movement L1 in the horizontal direction of the capillary becomes 1 or smaller.

Accordingly, the angle θ1 (shown in FIG. 4) of the movement of the capillary from the point B toward the point C on the side of the second bonding point while moving downward becomes 45° or smaller. When the amount of downward movement Z2 is 20 μm and the amount of XY movement L1 is 30 μm, the angle θ1 is about 34°.

Subsequently, the amount of XY movement L2 is determined to be 40 μm which corresponds to two-third (about 0.67) a diameter of 60 μm. The amount of upward movement Z3 and the amount of downward movement Z4 in the Z-axis direction are controlled in such a manner that the height at the point E shown in FIG. 4 becomes 40 μm, which is the intended loop height. The movement from the point D to the point E is made so that the ratio of the amount of downward movement Z4 of the capillary with respect to the amount of XY movement L2 of the capillary in the horizontal direction becomes 1 or larger. The amount of XY movement L2, which is for shaping the wire horizontal by the bottom portion 3b of the capillary 3, is set to secure a length required for said shaping.

Accordingly, the angle θ2 (shown in FIG. 4) of the movement of the capillary from the point D toward the point E on the side of the second bonding point while moving downward becomes 45° or larger. In other words, when the thickness of contact bonding is set to 10 μm, the value of (Z1-Z2) is 20 μm, and the intended loop height is 40 μm, the value of (Z3-Z4) is 10 μm from the expression (1). The movement from the point D to the point E is achieved by making the downward movement and the XY movement simultaneously, and is controlled to cause the capillary to move linearly. Accordingly, assuming that the angle θ2 from the point D to the point E is 45°, the amount of downward movement Z4 is 40 μm, and the amount of upward movement Z3 is 50 μm.

The amount of XY movement L2 of the capillary may be set to an amount corresponding to the length from the periphery of the bottom portion 3b of the capillary to the chamfer diameter to shape the wire by the bottom portion 3b of the capillary. For example, assuming that the diameter of the periphery of the bottom portion 3b of the capillary (a dimension T shown in FIG. 3) is 152 μm and the chamfer diameter CD is 64 μm, the length of the bottom portion 3b of the capillary is set to 44 μm, and the amount of XY movement L2 is set to 44 μm. Assuming that the amount of XY movement L2 is 44 μm and the angle θ2 from the point D to the point E is 45°, the amount of downward movement Z4 is 44 μm, and the amount of upward movement Z3 is 54 μm.

Although the amounts of XY movement L1 and L2 of the capillary are determined from the diameter of contact bonding, it may be determined from the dimensions and the shape of the chamfer surface 3a which defines the truncated-conical-shaped space of the capillary. Although the amount of upward movement, the amount of the downward movement, and the amount of the XY movement of the capillary are determined on the basis of the diameter of contact bonding or the dimension of the capillary in the description given thus far, these values may be also determined on the basis of the wire diameter to be used in bonding operation.

Although the representative values are exemplified as the amounts of upward movement Z1 and Z3, the amounts of downward movement Z2 and Z4, and the amounts of XY movement L1 and L2 of the capillary described above, allowable ranges may be provided for these values. The allowable ranges are ±30% of the values described above, respectively. For example, the amount of XY movement L1 of the capillary in the movement from the point B to the point C on the side of the second bonding point is 30 μm, which is the amount corresponding to a half (0.5) the value of 60 μm as the diameter of contact bonding, and the range of the XY movement L1 is 30 μm±30%, that is, from 21 to 39 μm. The height (Z1-Z2) at the point C shown in FIG. 4 is 20 μm, which corresponds to 0.5 times the intended loop height (40 μm in this case), and the range of the height (Z1-Z2) at the point C is 20 μm±30%, that is, from 14 to 26 μm. The representative value of the amount of upward movement Z1 is 40 μm, and the range of the amount of upward movement Z1 is from 28 to 52 μm. The representative value of the amount of downward movement Z2 is 20 μm, and the range of the amount of downward movement Z2 is from 14 to 26 μm. The range of the angle θ1 from the point B to the point C is from 20° to 44°.

The movement from the point D to the point E of the capillary is as follows. The representative value of the amount of XY movement L2 is 40 μm, and the range of the amount of XY movement L2 is from 28 to 52 μm. The representative value of (Z3-Z4) is 10 μm, and the range of (Z3-Z4) is from 7 to 13 μm. The representative value of the amount of upward movement Z3 is 50 μm, and the range of the amount of upward movement Z3 is from 35 to 65 μm. The representative value of the amount of downward movement Z4 is 40 μm, and the range of the amount of downward movement Z4 is from 28 to 52 μm. The range of the angle θ2 from the point D to the point E is from 45° to 62°.

In the formation of the low wire loop, the amounts of upward movement Z1 and Z3, the amounts of downward movement Z2 and Z4, and the amounts of XY movement L1 and L2 of the capillary are set to be variable with the desired diameter of contact bonding of the ball, the intended loop height, and the wire diameter. For example, when the desired diameter of contact bonding of the ball is larger, the amounts of XY movement L1 and L2 are set to larger values, and when the desired diameter of contact bonding of the ball is smaller, the amounts of XY movement L1 and L2 are set to smaller values. When the intended loop height is higher, the position of at least one of the point C and the point D is set to be higher, and when the intended loop height is lower, the position of at least one of the point C and the point D is set to be lower.

When the wire diameter is smaller, it is hot necessary to bend the wire with a strong force, and hence the position of the point E is set to be higher, and the amount of XY movement L2 is set to a smaller value. When the wire diameter is larger, it is necessary to bend the wire with a strong force, and hence the position of the point E is set to be lower, and the amount of XY movement L2 is set to a larger value. The amounts of upward and downward movements in the Z-axis direction, and the amount of XY movement described above may be changed as needed.

Referring now to FIG. 1 and FIG. 4, an operation of forming a low loop with the wire bonding apparatus 1 (shown in FIG. 1) will be described. The data such as the amount of upward movement Z1 of the capillary from the point A to the point B, the amount of downward movement Z2 of the capillary from the point B to the point C, the amount of upward movement Z3 of the capillary from the point C to the point D, the amount of downward movement Z4 of the capillary from the point D to the point E, the amount of XY movement L1 of the capillary from the point B to the point C, and the amount of XY movement L2 of the capillary from the point C to the point E as described above are entered using the numerical value entering key on the operation panel 23 on the basis of the menu displayed on the operation panel 23 (shown in FIG. 1) in advance, and the data are stored in a storage device of the microcomputer in the control device 17. It is also possible to calculate these values by entering data such as the intended loop height, the wire diameter, the diameter of contact bonding of the ball, and the angle of downward movement of the capillary (θ1, θ2 in FIG. 4), and automatically computing the values using the data. The data required for the bonding operation such as the XY coordinate values of the pad as the first bonding point and the lead as the second bonding point, the bonding parameter including the ultrasonic power and the duration of ultrasonic application, and others are to be set in advance.

First of all, the control device 17 reads out the XY coordinate values as the positional data of the pad as the first bonding point and the lead as the second bonding point to be bonded from the storage device. The control device 17 controls the XY table 12 to move the capillary 3 to a position right above the pad as the first bonding point. The control device 17 moves the bonding arm 2 downward to contact-bond the free air ball 36 at the distal end of the capillary 3 to the pad at the point A as the first bonding point. At this time, the control device 17 drives the piezoelectric transducer of the ultrasonic horn 2 by an ultrasonic oscillator at the preset ultrasonic power and for the preset duration of ultrasonic application, and applies a predetermined magnitude of load to the capillary 3 by the bonding head 6 for a predetermined duration. Accordingly, a contact-bonded ball having the intended diameter of contact bonding and the thickness of contact bonding is formed.

Subsequently, the control device 17 drives the bonding arm 2 and controls the capillary 3 to move upward to the point B on the basis of the amount of upward movement Z1. When the capillary comes to the point B, the bottom portion 3b of the capillary 3 is positioned facing the side surface of the contact-bonded ball 37. Then, the control device 17 drives the bonding arm 2 and the XY table 12 and controls the capillary 3 to move from the point B to the point C on the side of the second bonding point while moving downward. At this time, the amount of downward movement is Z2, and the amount of XY movement is L1. Accordingly, the chamfer surface 3a and the bottom portion 3b of the capillary 3 move downward while moving toward the second bonding point and press the side surface of the upper portion of the contact-bonded ball 37 including the neck portion 42 obliquely, so that the flat portion 40 as the inclined surface or the flat surface is formed in the area of the top portion 38 of the contact-bonded ball 37 on the side opposite from the second bonding point, and the protruded portion 41 having the neck portion 42 of the contact-bonded ball 37 is formed on the top portion 38 of the contact-bonded ball 37 on the side of the second bonding point.

Subsequently, the control device 17 drives the bonding arm 2, and moves the capillary 3 upward from the point C to the point D on the basis of the amount of upward movement Z3. When the capillary comes to the point D, the bottom portion 3b of the capillary 3 is positioned facing the side surface near the neck portion 42 of the protruded portion 41. Then, the control device 17 drives the bonding arm 2 and the XY table 12 and controls the capillary 3 to move from the point D to the point E on the side of the second bonding point while moving downward. At this time, the amount of downward movement is Z4, and the amount of XY movement is L2. Accordingly, the protruded portion 41 of the contact-bonded ball 37 is shaped so that the wire drawing portion 39 is formed in the area of the top portion 38 on the side of the second boding point and the wire extends horizontally from the wire drawing portion 39.

Subsequently, the control device 17 drives the bonding arm 2, and controls the capillary 3 to move upward to the point F while moving toward the second bonding point. By the upward movement of the capillary 3 while moving toward the second bonding point, the linearity of the wire 35 from the wire drawing portion 39 is maintained.

Then, the control device 17 drives the bonding arm 2, and moves the capillary 3 vertically upward to the point G. After having moved the capillary 3 in the vertical direction, the control device 17 drives the XY table 12, and controls the reverse movement in which the capillary 3 moves horizontally in the direction opposite from the second bonding point to the point H. With the reverse movement, the wire 35 is formed with a bent portion 35a. After having moved the capillary 3 to the point H, the control device 17 drives the bonding arm 2, and controls the capillary 3 to move vertically upward to the point I. After having moved the capillary 3 to the point I, the control device 17 drives the bonding arm 2 and the XY table 12 and controls the capillary 3 to come into contact with the point K as the second bonding point while moving downward through the point J so as to draw an arc toward the second bonding point. After the capillary 3 has come into contact with the second bonding point, the control device 17 drives the piezoelectric transducer by an ultrasonic oscillator at the preset ultrasonic power and for the preset duration of ultrasonic application, and applies a predetermined magnitude of load to the capillary 3 for a predetermined duration by the bonding head 6, so that the wire 35 is joined to the lead 33 of the second bonding point. After having joined the wire 35 to the lead 33 at the second bonding point, the control device 17 drives the bonding arm 2, and moves the capillary 3 upward while delivering the wire 35 from the distal end of the capillary 3. At a predetermined elevated position, the control device 17 closes the clamper 4, tears the wire 35 from the second bonding point, and then applies a high voltage to the EFO (Electric Flame Off) 5 (shown in FIG. 2) to form the free air ball 36 at the distal end of the wire 35. From then onward, the control device 17 repeats the operation as described above to bond a predetermined number of wires.

Figure 8:
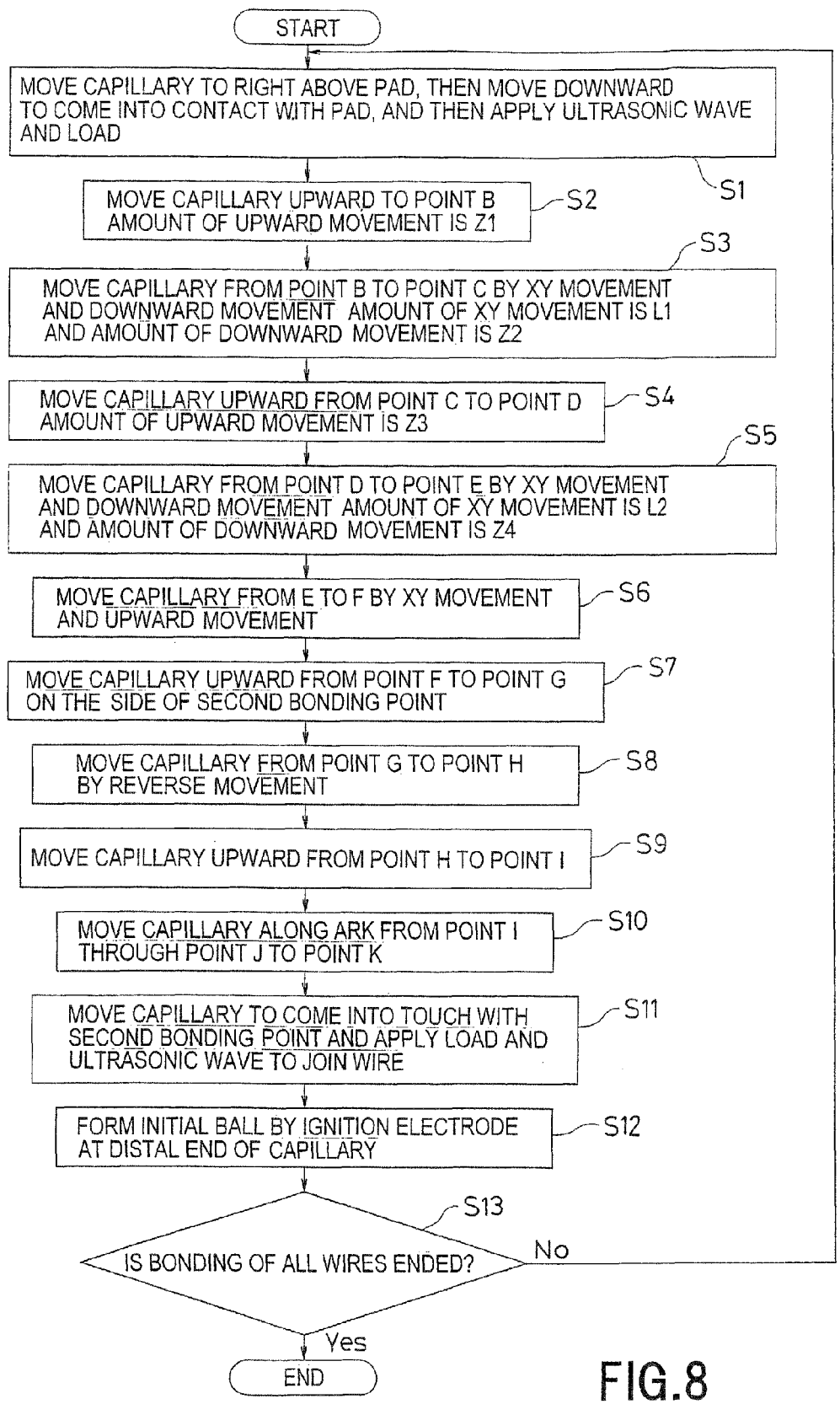
FIG. 8 is a flowchart of the control program for forming the low loop by a microcomputer.

Referring now to FIG. 1, FIG. 4, and FIG. 8, a control program for forming the low loop by the microcomputer in the control device in the wire bonding apparatus will be described. FIG. 8 is a flowchart of the control program for forming the low loop by the microcomputer.

The data required for bonding such as the XY coordinate values of the pad as the first bonding point and the lead as the second bonding point, the amounts of upward movement Z1 and Z3 of the capillary 3, the amounts of downward movement Z2 and Z4, and the amounts of XY movement L1 and L2 required for forming the loop, the bonding parameters such as the ultrasonic power and the duration of ultrasonic application, and others are to be set in advance.

First of all, the XY coordinate values of the pad as the first bonding point and the lead as the second bonding point to be bonded are read out. The XY table 12 is controlled to move the capillary 3 to a position right above the pad as the first bonding point. After having moved the capillary 3, the bonding arm 2 is moved downward. When the free air ball 36 at the distal end of the capillary 3 comes into contact with the pad, a control is made to emit an activation signal to the ultrasonic oscillator, apply the predetermined ultrasonic power to the piezoelectric transducer of the ultrasonic horn for a predetermined duration, and apply a predetermined load to the linear motor of the bonding head 6 for a predetermined duration, so that the free air ball 36 is brought into a press-contact with the pad to form the contact-bonded bail 37 (Step S1). Then, the amount of upward movement Z1 of the capillary 3 stored in the storage device is read out to move the bonding arm 2 by an amount corresponding to Z1, so that the capillary 3 is moved upward to the point B (Step S2).

Subsequently, the amount of downward movement Z2 and the amount of XY movement L1 stored in the storage device of the microcomputer in the control device 17 are read out, and the amount of movement in the X-axis direction and the amount of movement of the Y-axis direction are determined so that the amount of XY movement L1 is positioned on a line connecting the XY coordinate of the first bonding point and the XY coordinate of the second bonding point. The bonding arm 2 is moved downward on the basis of the amount of downward movement Z2, and the amount of movement in the X-axis direction and the amount of movement in the Y-axis direction which correspond to the amount of XY movement L1 are outputted to the drive device to move the capillary 3 from the point B to the point. C on the side of the second bonding point. The downward movement of the capillary 3 is controlled to be rectilinear. It is for forming the protruded portion 41 having the neck portion 42 of the contact-bonded ball 37 on the top portion 38 of the contact-bonded ball 37 on the side of the second boding point by moving the capillary 3 downward while moving toward the point C on the side of the second bonding point, and pressing the side surface of the upper portion of the contact-bonded ball 37 including the neck portion 42 obliquely (Step S3).

Subsequently, the capillary 3 is moved upward from the point C to the point D by reading the amount of upward movement Z3 stored in the storage device to move the bonding arm 2 by the amount Z3 (Step S4). Subsequently, the amount of downward movement Z4 and the amount of XY movement L2 stored in the storage device are read out, and the amount of movement in the X-axis direction and the amount of movement in the Y-axis direction are determined so that the amount of XY movement L2 is positioned on a line connecting the XY coordinate of the first bonding point and the XY coordinate of the second bonding point. The bonding arm 2 is moved downward on the basis of the amount of downward movement Z4, and the amount of movement in the X-axis direction and the amount of movement in the Y-axis direction which correspond to the amount of XY movement L2 are outputted to the drive device to move the capillary 3 from the point D to the point E on the side of the second bonding point. The downward movement of the capillary 3 is controlled to be rectilinear. It is for forming the wire drawing portion 39 for drawing the wire horizontally from the top portion 38 of the contact-bonded ball 37 by moving the capillary 3 downward while moving toward the second bonding point and pressing the protruded portion 41 having the neck portion 42 (Step S5). In the procedure as described above, the wire drawing portion is formed on the top portion of the contact-bonded ball at the first bonding point.

Subsequently, formation of the wire loop from the first bonding point to the second bonding point is performed. Because the amount of upward movement, the amount of downward movement, and the amount of XY movement of the capillary 3 from the point E onward are determined by the wire length between the first bonding point and the second bonding point and the length of the flat portion of the loop, the movement of the capillary 3 from the point E onward will be described relating to the mode of movement of the capillary 3.

The amount of XY movement from the point E to the point F is determined by the amount of movement in the X-axis direction and the amount of movement in the Y-axis direction so that they are positioned on the line connecting the XY coordinate of the first bonding point and the XY coordinate of the second bonding point. Then, the bonding arm 2 is moved upward, the amount of movement in the X-axis direction and the amount of movement in the Y-axis direction which correspond to the amount of XY movement to the point F are outputted to the drive device 16 to control the XY table 12 to move the capillary 3 upward from the point E to the point F on the side of the second bonding point. The upward movement of the capillary 3 is controlled to be rectilinear (Step S6).

Then, the bonding arm 2 is moved upward to move the capillary 3 upward from the point F to the point G on the side of the second bonding point (Step S7).

Then, the amount of movement in the X-axis direction and the amount of movement in the Y-axis direction which correspond to the amount of XY movement from the point G to the point H are outputted to the drive device to control the XY table 12, and the capillary 3 is moved from the point G to the point H on the opposite from the second bonding point to make the reverse movement (Step S8). After the reverse movement, the bonding arm 2 is moved upward so that the capillary 3 moves upward from the point H to the point I (Step S9). Then, the bonding arm 2 and the XY table 12 are controlled to cause the capillary 3 to make an arcuate movement from the point I to the point K as the second bonding point via the point 3 (Step S10). After having brought the capillary 3 into contact with the point K as the second bonding point, the piezoelectric transducer is driven by an ultrasonic oscillator at the preset ultrasonic wave power and for the preset duration of ultrasonic application, and applies a predetermined magnitude of load to the capillary 3 for a predetermined duration by the bonding head 6, so that the wire 35 is joined to the lead 33 of the second bonding point (Step S11).

Subsequently, the bonding arm 2 is moved upward, and a control is made to move the capillary 3 upward while delivering the wire 35 from the distal end of the capillary 3, the clamper 4 is closed at the predetermined elevated position, the wire 35 is torn from the second bonding point, and then a high-voltage is applied to the EFO (Electric Flame Off) 5 (shown in FIG. 2) to form the free air ball 36 at the distal end of the wire 35 (Step S12). From this onward, the operation from Step 1 is repeated to bond a predetermined number of wires (Step S13).

Figure 9:
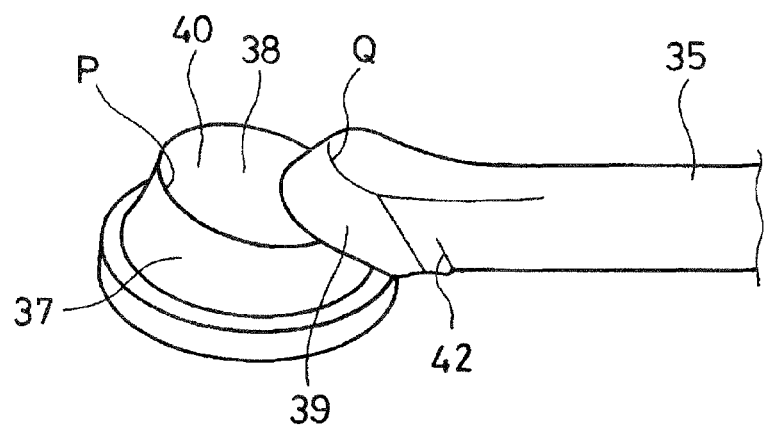
FIG. 9 is a drawing showing examples of the shapes of the contact-bonded ball and a wire drawing portion at a first bonding point according to the invention.

Referring now to FIG. 9, examples of the shape of the contact-bonded ball and the shape of the wire extending from the wire drawing portion at the first bonding point formed in the method of forming the low loop described thus far will be described. FIG. 9 shows the examples of the shapes of the contact-bonded ball and the wire drawing portion at the first bonding point.

As shown in FIG. 9, the contact-bonded ball 37 at the first bonding point has the flat portion 40 at a position on the top portion 38 thereof on the side opposite from the second bonding point, and the wire drawing portion 39 on the side of the second bonding point. The shape of the wire drawing portion 39 externally appears to be formed by joining the wire 35 to the top portion 38 of the contact-bonded ball 37 having a bump shape. However, the wire drawing portion 39 is formed integrally with the contact-bonded ball 37, and is not the member formed by joining the wire 35, so that the contact-bonded ball 37 and the wire drawing portion 39 have a sufficient strength. The wire 35 is drawn from the wire drawing portion 39 toward the second bonding point, and a loop is formed so as to extend horizontally with respect to the surface of the bonded part.

Figure 10:
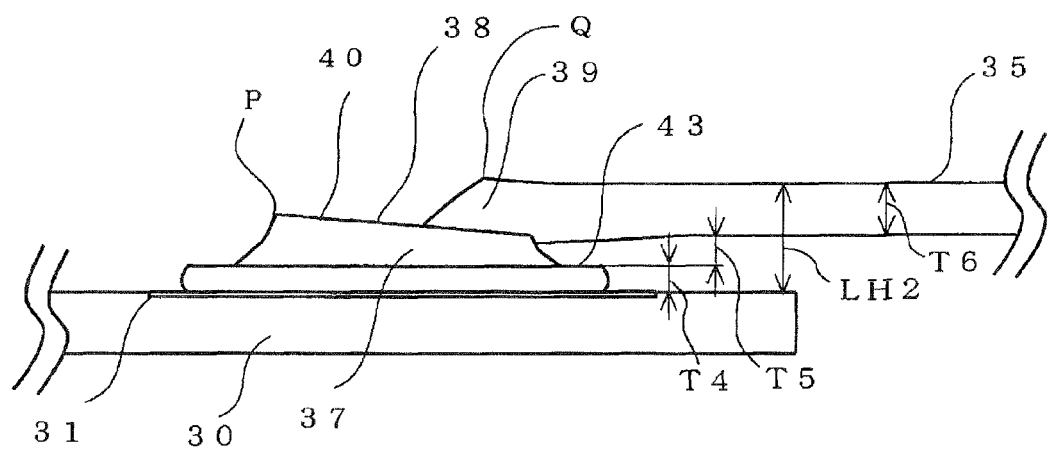
FIG. 10 is a drawing for explaining the shape of the low loop and the height of the loop according to the invention.
Figure 12:
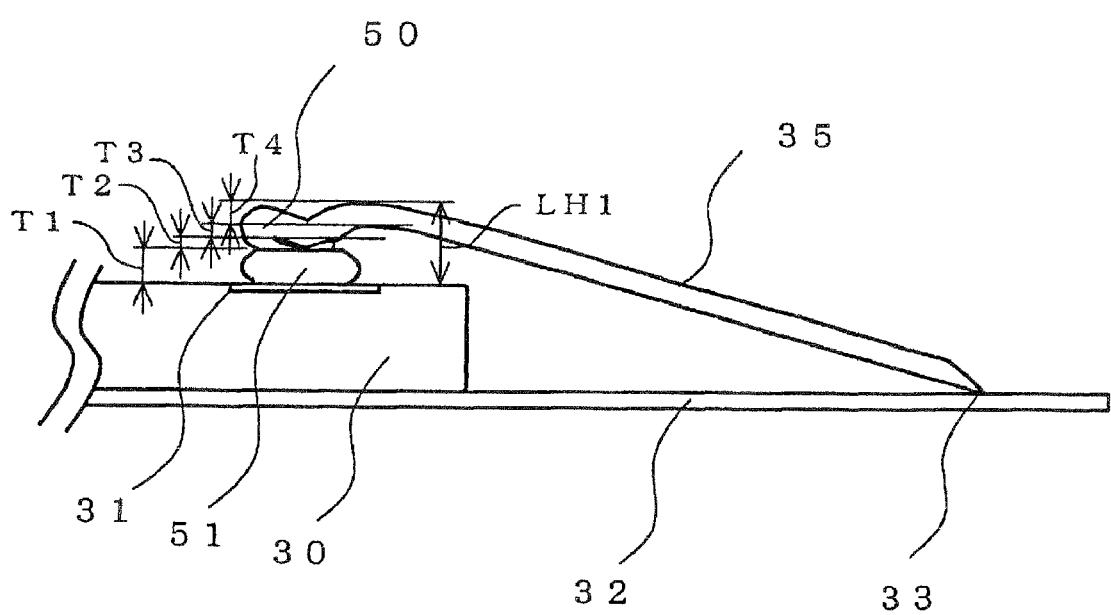
FIG. 12 is a drawing for explaining the shape of the low loop and the height of the loop in the related art.

Referring now to FIG. 10, the height of loop in the loop shape formed by the method of forming the loop according to the invention will be described. FIG. 10 is a drawing for explaining the shape of the low loop and the height of the loop in the invention, and showing the contact-bonded ball 37 and the wire 35 extending from the contact-bonded ball 37 near the first bonding point in the low loop formation between the pad 31 as the first bonding point on the semiconductor chip 30 and the lead 33 as the second bonding point on the lead frame 32 shown in FIG. 7D in detail.

As shown in FIG. 10, the contact-bonded ball 37 has the flat portion 40 at a position on the top portion 38 on the side opposite from the second bonding point, and the wire drawing portion 39 on the side of the second bonding point. The formation of the contact-bonded ball 37 shown in FIG. 10 is performed using the representative values shown in the description in [Amount of Movement of Capillary] given above as the amounts of upward movement Z1 and Z3, the amounts of downward movement Z2 and Z4, and the amounts of XY movement L1 and L2 of the capillary 3 shown in FIG. 4.

A loop height LH2 shown in FIG. 10 is the sum of a thickness of contact bonding T4, a gap T5 from the ball surface 43 to the lower surface of the wire 35, and a wire diameter T6. The point Q shown in FIG. 10 is the highest position of the wire, which corresponds to 40 μm which is the intended loop height when the capillary is moved downward to the point E shown in FIG. 4. The thickness of contact bonding T4 shown in FIG. 10 is 10 μm, the wire diameter T6 is 25 μm, and the gap length T5 between the contact-bonded surface and the wire is 5 μm. Therefore, the loop height LH2 is 40 μm, which is the intended loop height. In this manner, according to the wire bonding method, the wire bonding apparatus, and the wire bonding control program in the invention, the formation of loop having a height not exceeding two times the wire diameter is enabled.

A result of measurement of the loop height and the pull strength in the bonding performed on the basis of the method of forming the low loop described above using the wire having a diameter of 25 μm is shown in FIG. 11. FIG. 11 shows a result of measurement of the loop height and the pull strength using ten wires.

As shown in FIG. 11, the average value of the loop height with ten wires is 37.6 μm, and the maximum loop height is 41.4 μm. Therefore, the target to make the loop height not to exceed two times the wire diameter is sufficiently achieved. The average value of the pull strength is 4.8 gf, and the minimum value is 4.2 gf. Since the cutting mode of the wire is B mode (which means cutting from the neck portion) for every wire, it is confirmed that the sufficient pull strength is achieved in the method of forming the wire loop in the invention. Although it is not shown in FIG. 11, the ball shear strength confirmed by applying a load on the contact-bonded ball in the horizontal direction and measuring the load when the joint between the contact-bonded ball and the pad is broken is also sufficient, and in the separation mode which indicates the state of separation between the contact-bonded ball and the pad when the shear strength is measured, it is confirmed that gold remains on the pad in any cases.

As described above, it has been difficult to form the loop having a height not exceeding two times the wire diameter in the related art. However, according to the invention, since reduction of the height right above the first bonding point is achieved, formation of the loop having the height not exceeding two times the wire diameter is achieved.

Since the capillary 3 presses the side surface of the contact-bonded ball at the first bonding point while moving downward toward the second bonding point, a force in the horizontal direction applied to the contact-bonded ball is reduced and an influence on the joint between the pad and the contact-bonded ball is negligible, so that the joint strength between the pad and the contact-bonded ball is maintained.

Also, the cross-sectional area at the joint portion between the contact-bonded ball and the neck portion of the wire at the first bonding point is increased, and the strength required at the neck portion of the wire is maintained.

The invention is implemented in various modes without departing the essential feature of the invention. Therefore, the embodiment described above is illustrative only and, needless to say, the invention is not limited thereto.

What is claimed:

1. A wire bonding method for connecting a first bonding point and a second bonding point with an integrally formed wire using a capillary, the method comprising:
    contact-bonding a free air ball at a distal end of the capillary to the first bonding point to form a contact-bonded ball having a desired bonding thickness;
    moving the capillary upward after having formed the contact-bonded ball so that a chamfer surface of the capillary is positioned facing a side surface of an upper portion of the contact-bonded ball; and
    then pressing the side surface of the upper portion of the contact-bonded ball with the capillary while moving the capillary toward the second bonding point, to thereby form a top portion of the contact-bonded ball;
    wherein a protruded portion is formed on a side facing the second bonding point on the top portion of the contact-bonded ball.

* * * * *